United States Patent [19]

Covino et al.

[11] Patent Number: 5,841,720
[45] Date of Patent: Nov. 24, 1998

[54] FOLDED DUMMY WORLD LINE

[75] Inventors: James J. Covino, Montpelier; Alan L. Roberts, Jericho, both of Vt.; Jose R. Sousa, Sunnyvale, Calif.

[73] Assignee: International Business Machines Corporation, Armonk, N.Y.

[21] Appl. No.: 918,740

[22] Filed: Aug. 26, 1997

[51] Int. Cl.⁶ .................................................. G11C 7/02
[52] U.S. Cl. ......................................... 365/210; 365/207
[58] Field of Search .................................... 365/210, 207

[56] References Cited

U.S. PATENT DOCUMENTS

| | | | |
|---|---|---|---|
| 4,195,357 | 3/1980 | Kuo et al. | 365/210 |
| 4,680,735 | 7/1987 | Miyamoto et al. | 365/210 |
| 4,757,476 | 7/1988 | Fujishima et al. | 365/210 |
| 5,226,014 | 7/1993 | McManus | 365/210 |
| 5,265,047 | 11/1993 | Leung et al. | 365/210 |
| 5,280,443 | 1/1994 | Hidaka et al. | 365/63 |
| 5,381,374 | 1/1995 | Shiraishi et al. | 365/210 |
| 5,383,159 | 1/1995 | Kubota | 365/207 |
| 5,414,663 | 5/1995 | Komarek et al. | 365/210 |

*Primary Examiner*—David C. Nelms
*Assistant Examiner*—David Lam
*Attorney, Agent, or Firm*—Howard J. Walter, Jr.

[57] ABSTRACT

A memory array comprising a number of memory cells, a set path, a signal path, and at least one word line for transmitting a word line select signal to a row of the memory cells. The word line extends from a first driver end to a second end. The memory array further includes a dummy word line extending from the first driver end to a point between the first and second ends and back to the first end for transmitting a tracking signal responsive to the word line select signal. By folding the dummy word line in this manner, improved tracking of the set path with the signal path is achieved.

20 Claims, 3 Drawing Sheets

FOLDED DUMMY WORLD LINE

FIELD OF THE INVENTION

The invention relates to memory arrays and, more particularly, to static random access memory (SRAM) arrays.

BACKGROUND OF THE INVENTION

Prior Art

FIG. 1 shows the structure of a conventional SRAM memory array 1 and its corresponding decode and data/signal path. SRAM 1 includes memory cells 10.A0, 10.B0, ... 10.AN, 10.BN; M.A0, M.B0, ... M.AN, M.BN arranged in rows and columns. It should be noted that the term "row" refers to the memory array direction in which a plurality of memory cells are selected by way of word lines WL0, ..., WLM. In conventional memories, each of the memory cells 10.A0, ..., 10.BN in the selected row are generally coupled to one or a complementary pair of bit lines BLA0, BL$\overline{A0}$, BLB0, BL$\overline{B0}$, ..., BLAN, BL$\overline{AN}$, BLBN, BL$\overline{BN}$. The term "column" is used in this description to refer to the memory array direction in which one or more of the memory cells 10.A0, ..., M.BN in the selected row are selected for read or write access. In conventional memories, this is generally accomplished by coupling one of the bit lines to sense amplifier/write circuits 12.0, ..., 12.N or to an internal data bus. It is contemplated that such use of the terms "rows" and "columns" is consistent with a general understanding in the art.

As shown in FIG. 2, memory cells 10.A0, ..., M.BN each comprise six transistors: T1, T2, T3, T4, T5, and T6. FIG. 2 is a close-up view of memory cells 10.A0, ..., M.BN shown in FIG. 1. Transistors T1 and T2 are P-type transistors, whereas transistors T3–T6 are n-type transistors. Transistors T5 and T6 couple the memory cells to the word and bit lines. Transistor T5 includes a bit line contact B and a word line contact W, whereas transistor T6 includes a bit line contact $\overline{B}$ and a word line contact W.

Referring again to FIG. 1, SRAM memory array 1 further includes a row decoder or word line driver 14 which selects one word line WL0, ..., WLM by driving the selected word line high. Each word line is connected to a row of memory cells such as 10.A0, ..., 10.BN or M.A0, ..., M.BN across data outputs OUT0, ..., OUTN. Each column of memory cells 10.A0, ..., M.A0; 10.B0, ..., M.B0; 10.AN, ..., M.AN; and 10.BN, ..., M.BN are connected by bit line complementary pairs BLA0, BL$\overline{A0}$; BLB0, BL$\overline{B0}$; ... ; BLAN, BL$\overline{AN}$; BLBN, BL$\overline{BN}$, respectively. Bit lines BLA0, ..., BL$\overline{BN}$ are connected to column decoders 16.0, ..., 16.N. Each column decoder 16.0, ..., 16.N, in this example, selects from two memory cells in the selected row to be sensed by sense amplifiers 12.0, ..., 12.N. Column decoders 16.0, ..., 16.N and sense amplifiers 12.0, ..., 12.N are coupled to output buffers 18.0, ..., 18.N, respectively. Output buffers 18.0, ..., 18.N include data outputs OUT0, ..., OUTN.

The decode and data/signal path of SRAM circuit 1 includes row decoder 14 which selects one of the rows of memory cells, column decoders 16.0, ..., 16.N which select one of the columns of memory cells. SRAM array 1 further includes a dummy word line 20 which connects dummy cells 22.A0, 22.B0, ..., 22.AN, and 22.BN.

As shown in FIG. 3, dummy cells 22.A0, ..., 22.BN are identical to memory cells 10.A0, ..., M.BN except that bit line B of transistor T5 is coupled to ground instead of to one of the bit lines of a bit line complementary pair and bit line $\overline{B}$ of transistor T6 is coupled to a voltage source $V_{DD}$ instead of to the other bit line of the bit line complementary pair. FIG. 3 is a close-up view of dummy cells 22.A0, ..., 22.BN shown in FIG. 1.

Referring again to FIG. 1, dummy word line 20 extends from a dummy word line driver 24 adjacent to word line driver 14 to an intermediate buffer 26, for a length substantially equal to that of word lines WL0, ..., WLM. Word lines WL0, ..., WLM extend from a first word line driver 14 end adjacent to bit line BLA0 to a second end which essentially ends at bit line BL$\overline{BN}$. In a similar fashion, dummy word line 20 extends from dummy word line driver 24, or essentially bit line BLA0, to the second end, or bit line BL$\overline{BN}$. The output of intermediate buffer 26 is coupled to the input of a set signal driver 28 by a coupling wire or conductor 30. The output of set signal driver 28 is coupled to each sense amp 12.0, ..., 12.N by a set signal wire or conductor 32. A set signal (set SA) is required to actuate sense amplifiers 12.0, ..., 12.N. The set signal is driven from set signal driver 28 to each sense amplifier 12.0, ..., 12.N via wire 32. Set signal driver 28 outputs the set signal upon receipt of a tracking signal received from buffer 26 via wire 30. Buffer 26 outputs; the tracking signal upon receipt of a dummy word line drive signal propagating the distance of dummy word line 20 from driver 24.

The timing of the setting of sense amplifiers 12.0–12.N by the set signal is extremely critical. If the set signal sets a sense amplifier too early, then the data or information stored in the selected memory cell will not be sensed and thus will not be outputted from data outputs OUT0, ..., OUTN. If the set signal sets sense amplifiers 12.0, ..., 12.N too late, the memory access time will correspondingly be increased to an unacceptable level. In the example shown, N may equal 255, whereas M may equal 63, thus giving a 256 columns by 64 rows memory array.

In SRAMs where there are relatively short bit lines with respect to the length of the word lines, such as 64 cells per bit line and 256 or more sense amps, a set signal that tracks well with the signal or data development can be difficult to obtain. The set signal requires time to be buffered to drive the large load of 256 sense amps. On the other hand, the signal path is very fast due to the small number of cells on any given bit line.

In the example given, the dummy word line signal propagating from dummy word line driver 24 through the entire length of dummy word line 20 to buffer 26 and the tracking signal propagating from buffer 26 to set signal driver 28 via wire 30 has proven to introduce too much delay, causing the set signal to arrive at each sense amp 12.0, ..., 12.N too late to meet required memory access times.

Thus, what is needed is a memory array including means for tracking or mimicking its signal or data path to allow time for the buffering of the set signal so that the set signal tracks well with the signal or data path.

SUMMARY OF THE INVENTION

Accordingly, the present invention provides a memory array comprising a number of memory cells. The memory array further comprises at least one word line for transmitting a word line select signal wherein the word line extends from a first driver end to a second end. The memory array further includes a dummy word line which extends from the first driver end, to a point between the first and second ends and back to the first end for transmitting a tracking signal responsive to the word line select signal.

The present invention also provides a method for tracking a set path with a signal path in a memory array having a number of memory cells. The method comprises the steps of providing at least one word line for transmitting a word line select signal, wherein the word line extends from a first driver end to a second driver end; and providing at least one dummy word line extending from the first driver end, to a point between the first and second ends and back to the first end for transmitting a tracking signal responsive to the word line select signal.

The primary advantage of the present invention is the provision of a memory array and method for tracking the sense amp set signal with the cell or data signal so that the sense amp set signal arrives at the sense amps at the optimal time.

DETAILED DESCRIPTION OF A PREFERRED EMBODIMENT OF THE INVENTION

Figure 1:
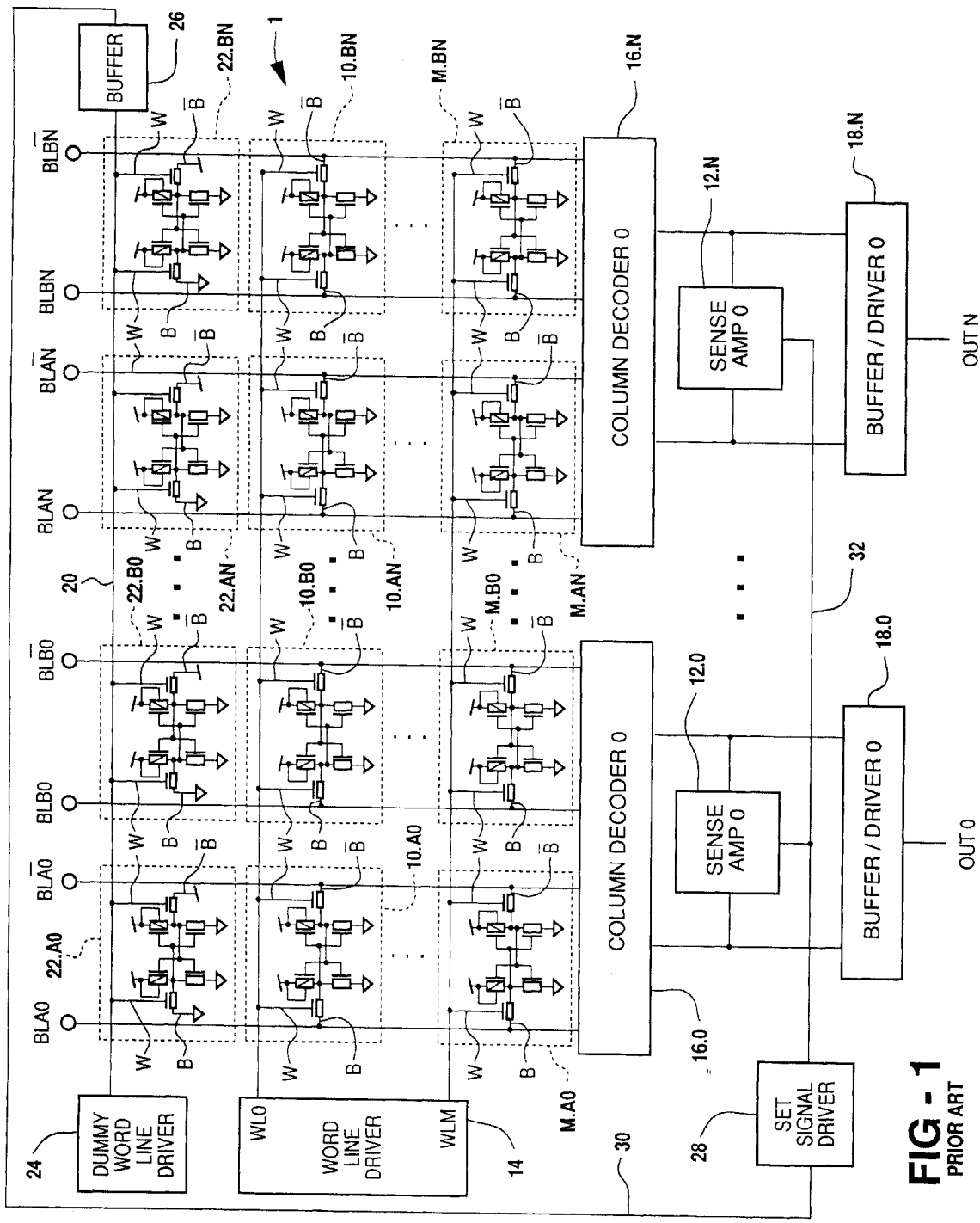
FIG. 1 is an electrical diagram, in schematic form, illustrating one prior art memory array into which the preferred embodiment of the present invention may be implemented.

FIG. 1 provided an example of a memory array into which the preferred embodiment of the present invention may be implemented. In this example, the memory array was an SRAM array of otherwise conventional architecture. It is contemplated that memory arrays of other types may also benefit from the present invention, such as read-only memories, FIFOs, DRAMs, and the like. Also, the internal components and operation of SRAMs are known to those skilled in the art, and therefore, the details of such will not be explained to any greater extent than necessary for understanding and appreciating the underlying concepts of the present invention.

Figure 4:
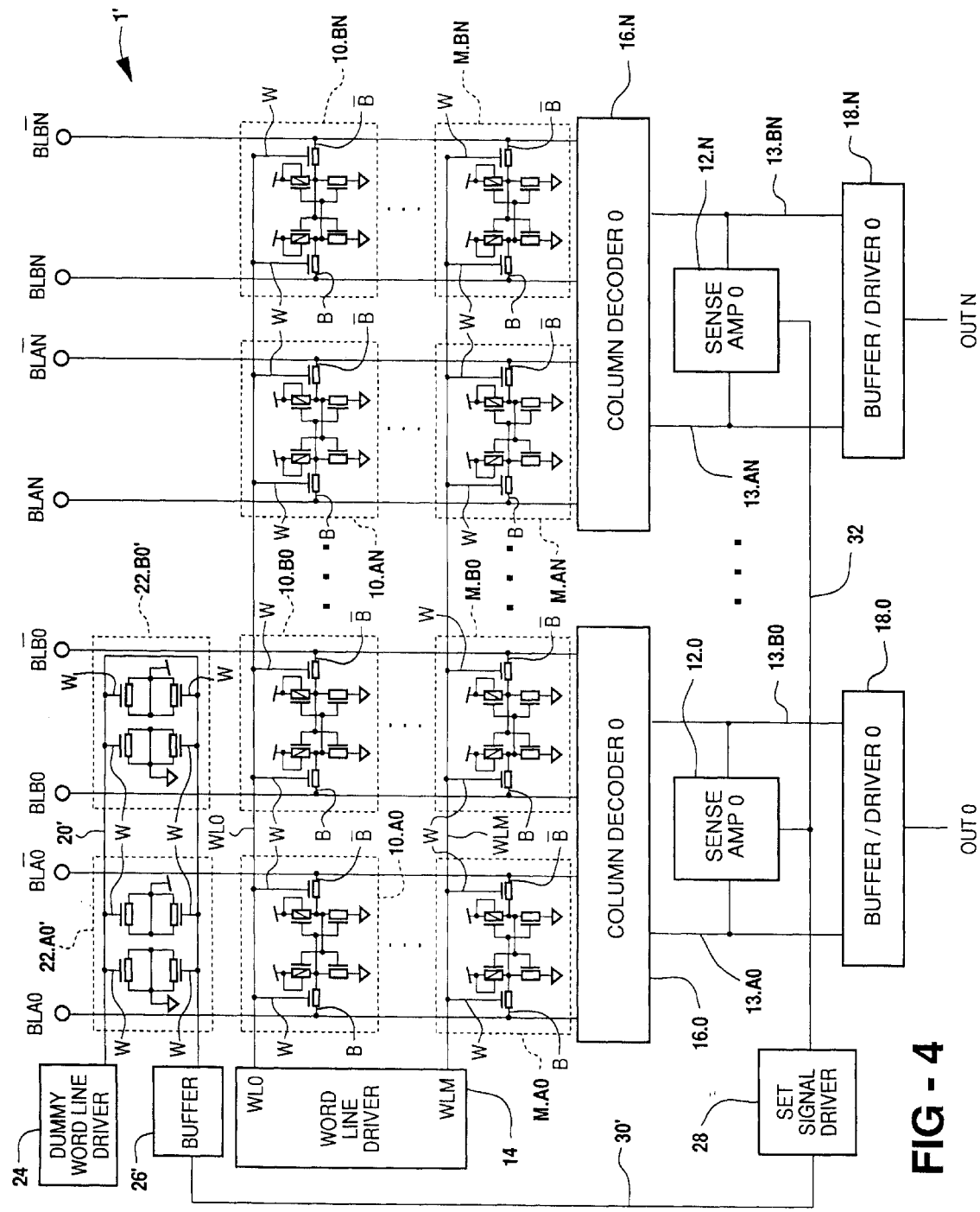
FIG. 4 is an electrical diagram, in schematic form, illustrating a memory array according to the present invention.

Referring now to FIG. 4, a memory array according to the present invention will be described. Reference numerals in FIG. 4 which are identical or similar to reference numerals in FIG. 1 indicate identical, like or similar components. The SRAM array depicted in FIG. 4 is identical to the SRAM array depicted in FIG. 1 except for the following described differences.

Dummy word line 20. extends from the first word line driver 14 end to a point between the first and second ends and back to the first end, transmitting a tracking signal which is responsive to the word line select signal. Thus, instead of extending from bit line BLA0 to bit line $B\overline{B}$, dummy word line 20. extends from bit line BLA0 to $$\frac{B\overline{B}NBL}{2}$$

and back to bit line BLA0 or halfway down the row of cells and back. In this manner, dummy word line 20. is folded such that the tracking signal propagates from dummy word line driver 24 and back to buffer 26. located adjacent to the first driver end. Wire 30. is thus much shorter than wire 30 of FIG. 1, and in this fashion, the tracking signal arrives at the set signal driver 28 much earlier than the tracking signal of FIG. 1.

In order to maintain a sufficient amount of voltage across sense amplifiers 12.0, . . . , 12.N under all process and application conditions, the set path must track with the data path. In other words, the delay of the signal or data path must be substantially equivalent to the delay of the set path, i.e., the path from dummy word line driver 24, through dummy word line 20., to buffer 26., through wire 30., to set signal driver 28, through wire 32 to sense amplifiers 12.0, . . . , 12.N.

In the memory array 1., the delay of the signal path is equal to the delay of the row decoder and word line driver 14 delay plus the word line WL0, . . . , WLM delay plus memory cell 10.A0, . . . M.BN delay plus bit line BLA0, . . . , $B\overline{B}$ delay, including delay caused by column decoders 16.0, . . . , 16.N plus the delay introduced by data lines 13.A0, 13.B0, . . . , 13.AN, 13.BN.

The delay of the set path is equal to the delay of the decoder/driver 14 and dummy word line driver 24 plus the dummy cell 22.A0., 22.B0., . . . 22.

$$\frac{(N0)}{2}B0.$$

delay plus buffer 26. delay plus wire 30. delay plus set signal driver 28 delay plus wire 32 delay. In this approach, both paths have the same decode delay, word driver delay, and word line delay.

Memory cell 10.A0, . . . , M.BN delay tracks the buffer 26. delay and wire delay of the bit lines BLA0, . . . , $B\overline{B}$ and data lines 13.A0 or 13.BN running from the column decoders 16.0, . . . , 16.N to the output buffers 18.0, . . . , 18.N tracks with the delay of wire 30.. Buffer 26. is faster than memory cells 10.A0, . . . , M.BN, but they do track; that is, if memory cells 10.A0, . . . , M.BN slow down by 10 percent, then buffer 26. slows down by 10 percent. It is desired to have buffer 26. faster than the memory cells 10.A0 , . . . , M.BN so that the set signal can arrive early enough to set sense amplifiers 12.0, . . . , 12.N. Time is required to buff the sense amp signal so it can drive its large load.

The delay of set signal driver 28 is adjusted to obtain the optimal timing relationship. By folding the dummy word line 20., a separate line is not needed to drive back the trigger signal to the set signal driver 28 so that the set signal travels in the same direction as the word line select signal.

Figure 2:
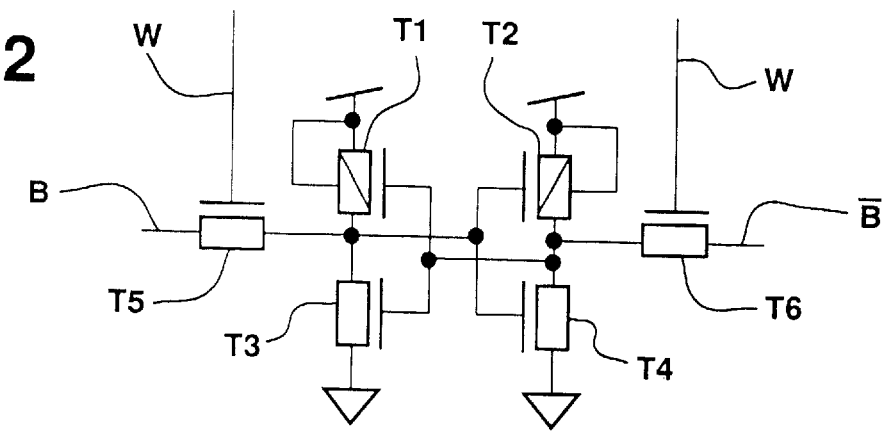
FIG. 2 is a close-up view of the memory cells shown in FIG. 1.
Figure 3:
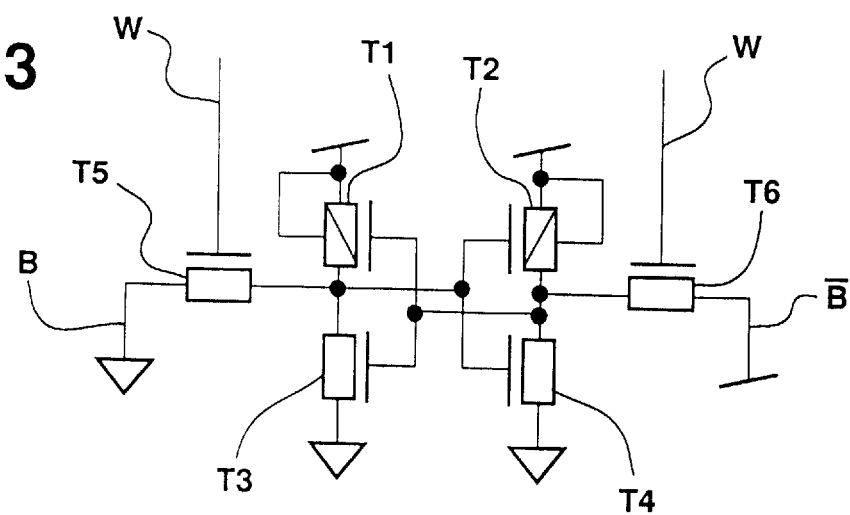
FIG. 3 is a close-up view of the dummy cells shown in FIG. 1.
Figure 5:
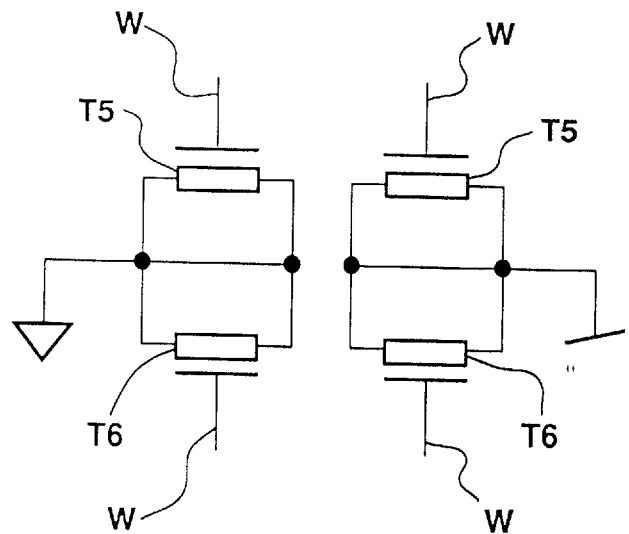
FIG. 5 is a close-up view of the dummy cells shown in FIG. 4.

As shown in FIG. 5, dummy cells 22.A0., 22.B0., 22.

$$\frac{(N0)}{2}B0.$$

each comprise two transistors T5 and T6 that are the identical sizes of transistors T5 and T6 in the cells of FIGS. 2 and 3. FIG. 5 is a close-up view of dummy cells 22.A0., 22.B0. . . .

$$22 \cdot \frac{(N0)}{2}B0.$$

shown in FIG. 4. The dummy cell shown in FIG. 5 has two less transistors than the cells shown in FIGS. 2 and 3 and can easily be contained in the same area as the cells shown in FIGS. 2 and 3. Dummy cells 22.A0., 22.B0., . . .

$$22 \cdot \frac{(N0)}{2} \; B0.$$

have a load of two memory cells 10.A0, . . . , M.BN with respect to the word driver end. In other words, dummy word line 20. picks up one load on the way down the dummy word line 20. and one load on the way back. Thus, the spacing or pitching of the dummy cells 22.A0., 22.B0., . . .

$$22 \cdot \frac{(N0)}{2} \; B0.$$

is equivalent to the spacing of the memory cells 10.A0–M.BN. Since the load that the word line sees on the cell of FIG. 5 is twice the load as the cell of FIG. 3, the dummy word line of FIG. 4 travels the same distance and sees the same load as the dummy word line of FIG. 1 while returning back to where it started.

Although the present invention and its advantages have been described in detail, it should be understood that various changes, substitutions and alterations can be made herein without departing from the spirit or scope of the invention as defined in the appended claims.

What is claimed is:

1. A memory array comprising;
   a number of memory cells;
   at least one word line for transmitting a word line select signal, said word line extending from a first driver end to a second end; and
   at least one dummy word line extending from said first driver end to the midpoint between said first driver end and said second end and back to said first driver end for transmitting a tracking signal responsive to said word line select signal.

2. The memory array, as recited in claim 1, wherein said memory array is a random access memory array.

3. The memory array, as recited in claim 1, wherein said memory array is a static random access memory array.

4. The memory array, as recited in claim 1, wherein said memory cells are coupled to said word line and further comprising dummy cells coupled to said dummy word line.

5. The memory array, as recited in claim 4, wherein the pitch of said dummy cells is equal to the pitch of said memory cells.

6. The memory array, as recited in claim 4, wherein each said dummy cell has a load equal to the load of two of said memory cells with respect to said driver end.

7. The memory array, as recited in claim 1, further including set signal driver means adjacent to said driver end for generating a set signal in response to receipt of said tracking signal.

8. The memory array, as recited in claim 7, wherein said set signal travels in the same direction as said word line select signal.

9. The memory array, as recited in claim 7, further including at least one sense amplifier for sensing information stored in said memory cells.

10. The memory array, as recited in claim 9, wherein said set signal driver means includes output means coupled to said sense amplifier for sending said set signal to said sense amplifier, wherein said sense amplifier senses information stored in said memory cells upon receipt of said set signal.

11. In a memory array having a number of memory cells, a signal path and a set path, a method fro tracking said set path with said signal path comprising:
   providing at least one word line for transmitting a word line select signal, wherein said word line extends from a first driver end to a second end; and
   providing at least one dummy word line extending from said first driver end to the midpoint between said first driver end and said second end and back to said first driver end for transmitting a tracking signal responsive to said word line select signal.

12. The method, as recited in claim 11, wherein said memory array is a random access memory array.

13. The method, as recited in claim 11, wherein said memory array is a static random access memory array.

14. The method, as recited in claim 11, wherein said memory cells are coupled to said word line and further comprising dummy cells coupled to said dummy word line.

15. The method, as recited in claim 14, wherein the pitch of said dummy cells is equal to the pitch of said memory cells.

16. The method, as recited in claim 14, wherein each said dummy cell has a load equal to the load of two of said memory cells with respect to said driver end.

17. The method, as recited in claim 11, further comprising the step of providing a set signal driver adjacent to said first driver end for generating a set signal in response to receipt of said tracking signal.

18. The method, as recited in claim 17, wherein said set signal travels in the same direction as said word line select signal.

19. The method, as recited in claim 17, further comprising the step of providing at least one sense amplifier for sensing information stored in said memory cells.

20. The method, as recited in claim 19, wherein said set signal driver includes an output coupled to said sense amplifier for sending said set signal to said sense amplifier, wherein said sense amplifier senses information stored in said memory cells upon receipt of said set signal.

\* \* \* \* \*